United States Patent
Shih et al.

(10) Patent No.: US 9,390,931 B1
(45) Date of Patent: Jul. 12, 2016

(54) MANUFACTURING METHOD OF STRIP-SHAPED CONDUCTIVE STRUCTURES AND NON-VOLATILE MEMORY CELL

(71) Applicant: Powerchip Technology Corporation, Hsinchu (TW)

(72) Inventors: Kai-Yao Shih, Hsinchu (TW); Ssu-Ting Wang, Taichung (TW); Chi-Kai Feng, Hsinchu (TW); Te-Yuan Yin, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/813,137

(22) Filed: Jul. 30, 2015

(30) Foreign Application Priority Data

Jun. 8, 2015 (TW) .............................. 104118516 A

(51) Int. Cl.
| | |
|---|---|
| *H01L 21/764* | (2006.01) |
| *H01L 21/28* | (2006.01) |
| *H01L 27/115* | (2006.01) |
| *H01L 29/06* | (2006.01) |
| *H01L 21/3205* | (2006.01) |
| *H01L 21/285* | (2006.01) |
| *H01L 21/02* | (2006.01) |
| *H01L 21/3213* | (2006.01) |
| *H01L 29/788* | (2006.01) |

(52) U.S. Cl.
CPC .... *H01L 21/28273* (2013.01); *H01L 21/02164* (2013.01); *H01L 21/28556* (2013.01); *H01L 21/32055* (2013.01); *H01L 21/32133* (2013.01); *H01L 21/32134* (2013.01); *H01L 21/32139* (2013.01); *H01L 27/11521* (2013.01); *H01L 29/0649* (2013.01); *H01L 29/7883* (2013.01)

(58) Field of Classification Search
None
See application file for complete search history.

(56) References Cited

U.S. PATENT DOCUMENTS

| | | | |
|---|---|---|---|
| 6,140,182 A | 10/2000 | Chen | |
| 8,455,923 B2 | 6/2013 | Lee et al. | |
| 2005/0245029 A1* | 11/2005 | Choi | H01L 27/11521 438/257 |
| 2008/0081432 A1* | 4/2008 | Kim | H01L 21/823437 438/424 |

(Continued)

FOREIGN PATENT DOCUMENTS

| | | |
|---|---|---|
| TW | 554471 | 9/2003 |
| TW | 200725817 | 7/2007 |

OTHER PUBLICATIONS

"Office Action of Taiwan Counterpart Application", issued on Mar. 15, 2016, p. 1-p. 7.

*Primary Examiner* — Alexander Ghyka
(74) *Attorney, Agent, or Firm* — Jianq Chyun IP Office

(57) ABSTRACT

A manufacturing method of floating gate is disclosed. A substrate having a plurality of isolation structures is provided, and top surfaces of the isolation structures are higher than a top surface of the substrate. A first conductive layer is formed on the substrate. A sacrificial layer is formed on the first conductive layer. Parts of the sacrificial layer are removed while parts of the sacrificial layer on the first conductive layer between the isolation structures are remained. Parts of the first conductive layer are removed by using the remaining parts of the sacrificial layer as masks to form conductive structures between the adjacent isolation structures. The remaining parts of the sacrificial layer are removed. A second conductive layer is formed on the substrate and the second conductive layer electrically connects with the conductive structures. The second conductive layer and the conductive structures are patterned to form floating gates.

15 Claims, 4 Drawing Sheets

(56) References Cited

U.S. PATENT DOCUMENTS

| | | | |
|---|---|---|---|
| 2008/0308860 A1* | 12/2008 | Kang | H01L 21/28273 257/326 |
| 2009/0085096 A1* | 4/2009 | Park | H01L 21/31111 257/324 |
| 2013/0059422 A1* | 3/2013 | Lee | H01L 21/764 438/268 |
| 2013/0102124 A1* | 4/2013 | Nakazawa | H01L 21/764 438/422 |
| 2013/0122685 A1* | 5/2013 | Kim | H01L 21/76232 438/424 |
| 2013/0183819 A1* | 7/2013 | Utsuno | H01L 27/115 438/585 |
| 2014/0248755 A1* | 9/2014 | Lee | H01L 21/76229 438/422 |
| 2015/0357326 A1* | 12/2015 | Bae | H01L 27/088 257/368 |
| 2016/0111291 A1* | 4/2016 | Kim | H01L 29/0649 438/587 |

* cited by examiner

MANUFACTURING METHOD OF STRIP-SHAPED CONDUCTIVE STRUCTURES AND NON-VOLATILE MEMORY CELL

CROSS-REFERENCE TO RELATED APPLICATION

This application claims the priority benefit of Taiwan application serial no. 104118516, filed on Jun. 8, 2015. The entirety of the above-mentioned patent application is hereby incorporated by reference herein and made a part of this specification.

BACKGROUND OF THE INVENTION

1. Field of the Invention

The invention generally relates to a manufacturing method of a semiconductor device, more particularly, to a manufacturing method of strip-shaped conductive structures and a non-volatile memory cell.

2. Description of Related Art

Non-volatile memory, due to having advantages in being capable of performing actions, such as data storing, accessing and erasing, for multiple times and not losing the stored data after power failure, has been broadly used in personal computer and electronic equipment.

The non-volatile memory is typically designed as a non-volatile memory cell structure, which includes a tunneling dielectric layer, floating gates, an inter-gate dielectric layer and a control gate that are sequentially disposed on a substrate.

A typical manufacturing process of a non-volatile memory cell structure is to define the non-volatile memory cell structures through a lithography and etching process, after sequentially forming a tunneling dielectric material layer, a floating gate material layer, an inter-gate dielectric material layer and a control gate material layer on a substrate, and to form a plurality of isolation structures between the non-volatile memory cell structures.

However, due to circuit design and application requirements, the non-volatile memory, other than having the non-volatile memory cell structure, further has a logic circuit structure. In terms of manufacturing process, the manufacturing process of the non-volatile memory cell structure has to be integrated with the manufacturing process of the logic circuit structure. Unlike the manufacturing process of the non-volatile memory cell structure, typical manufacturing process of the logic circuit structure will firstly define the isolation structures and an active region in the substrate, wherein top surfaces of the isolation structures will be higher than a top surface of the substrate by a step-high. In order for material layers with similar properties to be used in the non-volatile memory cell structure and the logic circuit structure at the same time, the typical manufacturing process of the logic circuit structure or the like is generally preferred, namely, firstly defining the isolation structures and the active region in the substrate.

However, because the top surfaces of the isolation structures will be higher than the top surface of the substrate when using the typical manufacturing process of the logic circuit structure or the like, the floating gates of the non-volatile memory cell are prone to have sharp corners at the peripheral regions and indentations at the center regions during the subsequent foil ling process of the non-volatile memory cell structure, wherein the sharp corners and the indentations may cause local electric field concentration, and thus when the memory cell executes programming and erasing steps, situations such as power leakage and so forth are liable to occur, thereby resulting in data interpretation errors and other problems, and thus a reliability of the semiconductor device would be affected.

SUMMARY OF THE INVENTION

The invention provides a manufacturing method of strip-shaped conductive structures which is capable of adjusting the shapes of the floating gates, so as to improve a reliability of a semiconductor device.

The invention provides a manufacturing method of a non-volatile memory cell which is capable of adjust the shapes of floating gates of the non-volatile memory cell, so as to improve a reliability of a semiconductor device.

A manufacturing method of strip-shaped conductive structures of the invention includes the following steps. Firstly, a substrate having a plurality of isolation structures is provided, wherein top surfaces of the isolation structures are higher than a top surface of the substrate. Next, a first conductive layer is formed on the substrate. Then, a sacrificial layer is formed on the first conductive layer. Further, parts of the sacrificial layer are removed while parts of the sacrificial layer on the first conductive layer between the isolation structures are remained. Next, parts of the first conductive layer are removed by using the remaining parts of the sacrificial layer as masks, so as to form a plurality of first conductive structures between the adjacent isolation structures. Afterwards, the remaining parts of the sacrificial layer are removed. Then, a second conductive layer is formed on the substrate, wherein the second conductive layer is electrically connected with the conductive structures. Finally, the second conductive layer and the first conductive structures are patterned to form the strip-shaped conductive structures.

In one embodiment of the invention, in the manufacturing method of the strip-shaped conductive structures, before the step of forming the first conductive layer on the substrate, the following step is further included: forming a tunneling dielectric layer on the substrate between the isolation structures.

In one embodiment of the invention, in the manufacturing method of the strip-shaped conductive structures, a method for forming the first conductive layer, the sacrificial layer and the second conductive layer respectively includes chemical vapor deposition.

In one embodiment of the invention, in the manufacturing method of the strip-shaped conductive structures, a method for removing the sacrificial layer includes wet etching.

In one embodiment of the invention, in the manufacturing method of the strip-shaped conductive structures, a method for removing parts of the first conductive layer includes dry etching or wet etching.

In one embodiment of the invention, in the manufacturing method of the strip-shaped conductive structures, a material of the sacrificial layer includes silicon oxide or silicon nitride.

In one embodiment of the invention, in the manufacturing method of the strip-shaped conductive structures, materials of the first conductive layer and the second conductive layer respectively include polysilicon or doped polysilicon.

A manufacturing method of a non-volatile memory cell of the invention includes the following steps. Firstly, a substrate having a plurality of isolation structures is provided, wherein top surfaces of the isolation structures are higher than a top surface of the substrate. Next, a tunneling dielectric layer is formed on the substrate between the isolation structures. Then, a first conductive layer is formed on the substrate. Further, a sacrificial layer is formed on the first conductive layer. Next, parts of the sacrificial layer are removed while parts of the sacrificial layer on the first conductive layer between the isolation structures are remained. Then, parts of the first conductive layer are removed by using the remaining parts of the sacrificial layer as masks, so as to form a plurality of first conductive structures between the adjacent isolation structures. Afterwards, the remaining parts of the sacrificial layer are removed. Next, a second conductive layer is formed on the substrate, wherein the second conductive layer is electrically connected with the first conductive structures. Then, the second conductive layer and the first conductive structures are patterned to form a plurality of second conductive structures. Further, a dielectric layer and a third conductive layer are sequentially formed on the substrate. Finally, the third conductive layer, the dielectric layer and the second conductive structures are patterned to form the non-volatile memory cell.

In one embodiment of the invention, in the manufacturing method of the non-volatile memory cell, methods for forming the first conductive layer, the sacrificial layer, the second conductive layer, the dielectric layer and the third conductive layer respectively include chemical vapor deposition.

In one embodiment of the invention, in the manufacturing method of the non-volatile memory cell, a method for removing the sacrificial layer includes wet etching.

In one embodiment of the invention, in the manufacturing method of the non-volatile memory cell, a method for removing the first conductive layer includes dry etching or wet etching.

In one embodiment of the invention, in the manufacturing method of the non-volatile memory cell, a material of the sacrificial layer includes silicon oxide or silicon nitride.

In one embodiment of the invention, in the manufacturing method of the non-volatile memory cell, materials of the first conductive layer, the second conductive layer and the third conductive layer respectively include polysilicon or doped polysilicon.

In one embodiment of the invention, in the manufacturing method of the non-volatile memory cell, materials of the dielectric layer include silicon oxide/silicon nitride/silicon oxide.

In one embodiment of the invention, in the manufacturing method of the non-volatile memory cell, the third conductive layer is used as a control gate, the dielectric layer is used as an inter-gate dielectric layer, and the second conductive structures are used as floating gates.

In view of the above, the manufacturing method of the strip-shaped conductive structures, as provided in the invention, forms the conductive structures between the adjacent isolation structures. The conductive structures fill up the trenches between parts of the adjacent isolation structures, so that the floating gates can be adjusted to have planar shapes during the subsequent forming process of the floating gates, and thereby improve the reliability of the semiconductor device.

In view of the above, the manufacturing method of the non-volatile memory cell, as provided in the invention, can integrate the manufacturing process of a non-volatile memory cell structure and a logic circuit structure, so that the non-volatile memory cell structure and the logic circuit structure can together be formed in a same manufacturing process.

In view of the above, the manufacturing method of the non-volatile memory cell, as provided in the invention, forms the conductive structures between the adjacent isolation structures. The conductive structures fill up the trenches between parts of the adjacent isolation structures, so that the floating gates of the non-volatile memory cell can be adjusted to have planar shapes during the subsequent forming process of the floating gates. Further, during the subsequent forming process of the control gate, the control gate can be adjusted to have a planar shape, so that the reliability of the semiconductor device can be improved.

In order to make the aforementioned features and advantages of the present invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1G are schematic cross-sectional diagrams illustrating a manufacturing process of a non-volatile memory cell according to an embodiment of the invention.

Figure 1A:
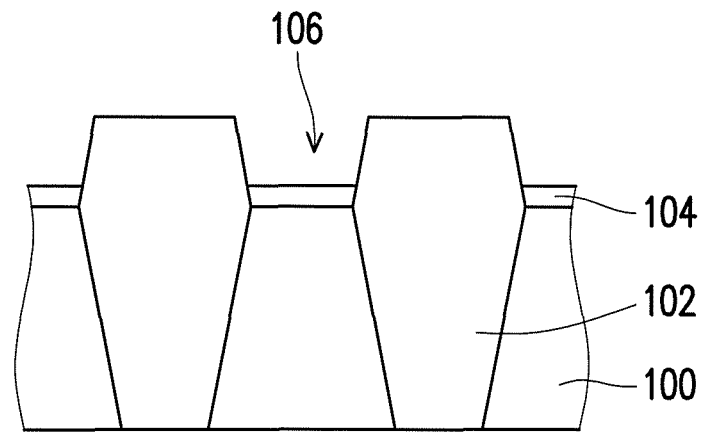
FIG. 1A to FIG. 1G are schematic cross-sectional diagrams illustrating a manufacturing process of a non-volatile memory cell according to an embodiment of the invention.

Referring to FIG. 1A, a substrate 100 having a plurality of isolation structures 102 is provided, and top surfaces of the isolation structures 102 is higher than a top surface of the substrate 100. The isolation structures 102 are, for example, shallow trench isolation structures. The isolation structures 102 have trenches 106 therebetween.

Next, a tunneling dielectric layer 104 is formed on the substrate 100 between the isolation structures 102. A material of the tunneling dielectric layer 104 includes a dielectric material, such as silicon oxide. A method for forming the tunneling dielectric layer 104 is, for example, thermal oxidation or chemical vapor deposition.

Figure 1B:
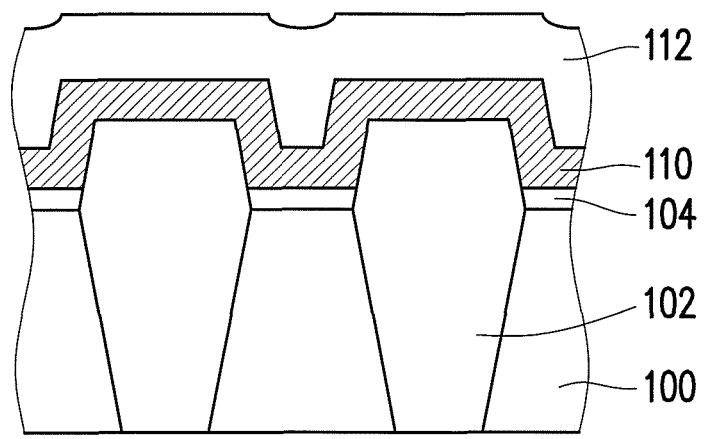

Referring to FIG. 1B, a conductive layer 110 is formed on the substrate 100. A material of the conductive layer 110 includes a conductive material, such as polysilicon, doped polysilicon or so forth. A method for forming the conductive layer 110 is, for example, chemical vapor deposition.

Then, a sacrificial layer 112 is formed on the conductive layer 110. A material of the sacrificial layer 112 must have an appropriate etching selectivity with the material of the conductive layer 110; otherwise, it is not particularly limited. In the present embodiment, the material of the sacrificial layer 112 is, for example, silicon oxide or silicon nitride. A method for forming the sacrificial layer 112 is, for example, chemical vapor deposition.

Figure 1C:
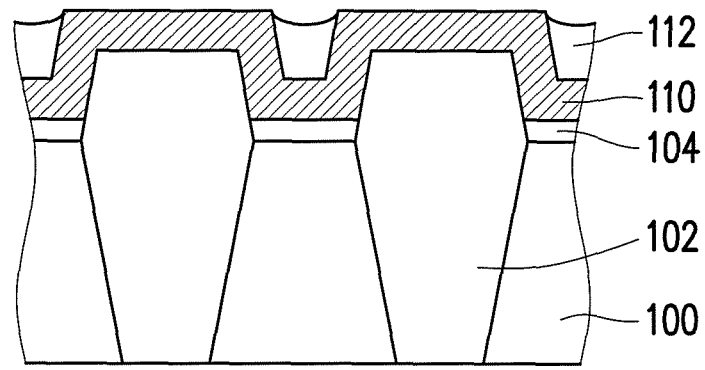

Referring to FIG. 1C, parts of the sacrificial layer 112 is removed, while parts of the sacrificial layer 112 on the conductive layer 110 between the isolation structures 102 are remained. A method for removing the sacrificial layer 112 is, for example, wet etching, whereby an etchant thereof is, for example, selected from a group consisting of hydrofluoric acid (HF) and phosphoric acid ($H_3PO4$). For instance, when the material of the sacrificial layer 112 is the silicon oxide, the sacrificial layer 112 is removed by using the hydrofluoric acid (HF) as the etchant; and when the material of the sacrificial layer 112 is the silicon nitride, the sacrificial layer 112 is removed by using the phosphoric acid ($H_3PO4$) and the hydrofluoric acid (HF) as the etchant.

Figure 1D:
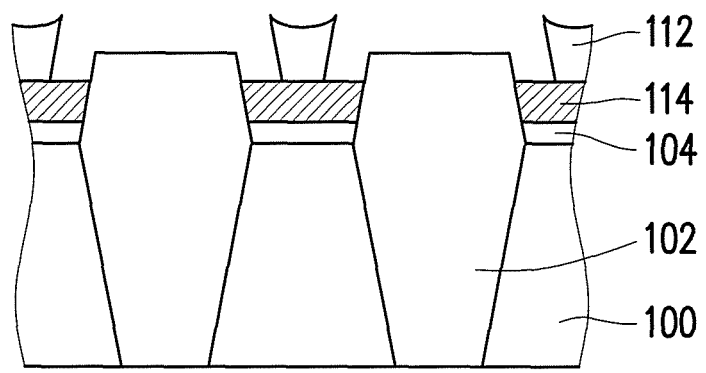

Referring to FIG. 1D, parts of the conductive layer 110 are removed by using the remaining parts of the sacrificial layer 112 as masks, so as to form a plurality of conductive structures 114 at the trenches 106 between the adjacent isolation structures 102. The conductive structures 114 fill up the trenches 106 between parts of the adjacent isolation structures 102. A method for removing parts of the conductive layer 110 is, for example, dry etching or wet etching.

Figure 1E:
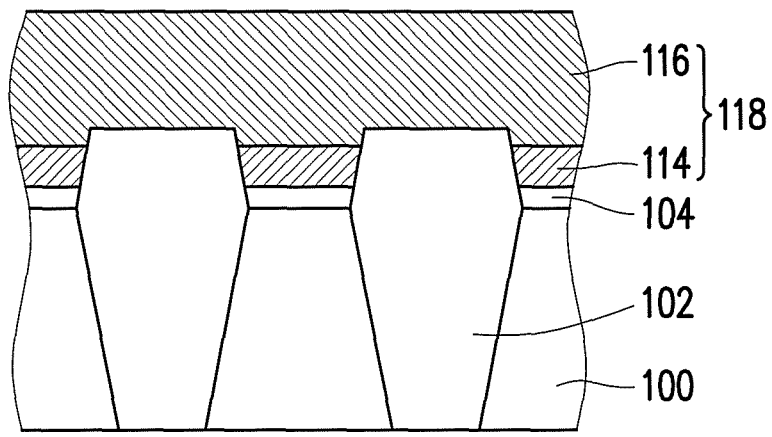

Referring to FIG. 1E, the remaining parts of the sacrificial layer 112 are removed. A method for removing the sacrificial layer 112 is, for example, wet etching, whereby an etchant therefore is, for example, selected from a group consisting of hydrofluoric acid (HF) and phosphoric acid ($H_3PO4$). For instance, when the material of the sacrificial layer 112 is the silicon oxide, the sacrificial layer 112 is removed by using the hydrofluoric acid (HF) as the etchant; and when the material of the sacrificial layer 112 is the silicon nitride, the sacrificial layer 112 is removed by using the phosphoric acid ($H_3PO4$) and the hydrofluoric acid (HF) as the etchant. During the process of removing the sacrificial layer 112, parts of the isolation structures 102 may also be removed at the same time.

Next, a conductive layer 116 is formed on the substrate 100, and the conductive layer 116 is electrically connected with the conductive structures 114. A material of the conductive layer 116 includes a conductive material, such as polysilicon, doped polysilicon or so forth. A method for forming the conductive layer 116 is, for example, chemical vapor deposition.

Figure 1F:
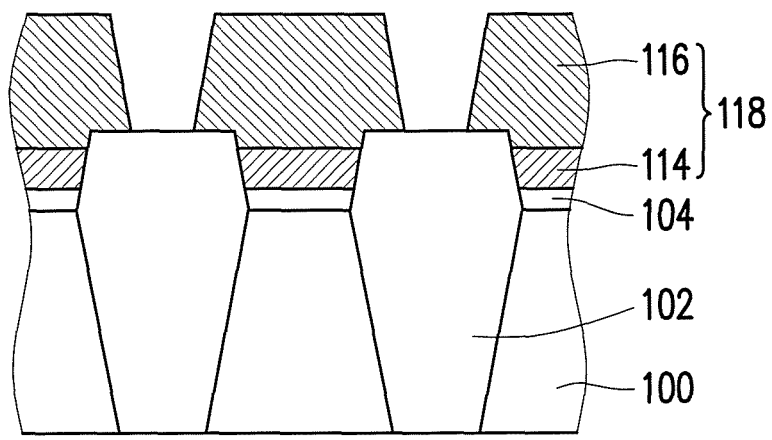

Referring to FIG. 1F, the conductive layer 116 and the conductive structures 114 are patterned to form a plurality of strip-shaped conductive structures 118. A method for patterning the conductive layer 116 and the conductive structures 114 is, for example, firstly forming a patterned photoresist layer on the conductive layer 116 and then removing parts of the conductive layer 116 by using the patterned photoresist layer as a mask. A method for forming the patterned photoresist layer is, for example, firstly forming a layer of photoresist material layer on the entire substrate 100 and then performing an exposure and a development procedures to form a strip patterned photoresist layer, which is parallel to the isolation structures 102, above the trenches 106. A method for removing parts of the conductive layer 116 is, for example, dry etching or wet etching. The remaining parts of the conductive layer 116 and the conductive structures 114 together constitute the conductive structures 118.

Figure 1G:
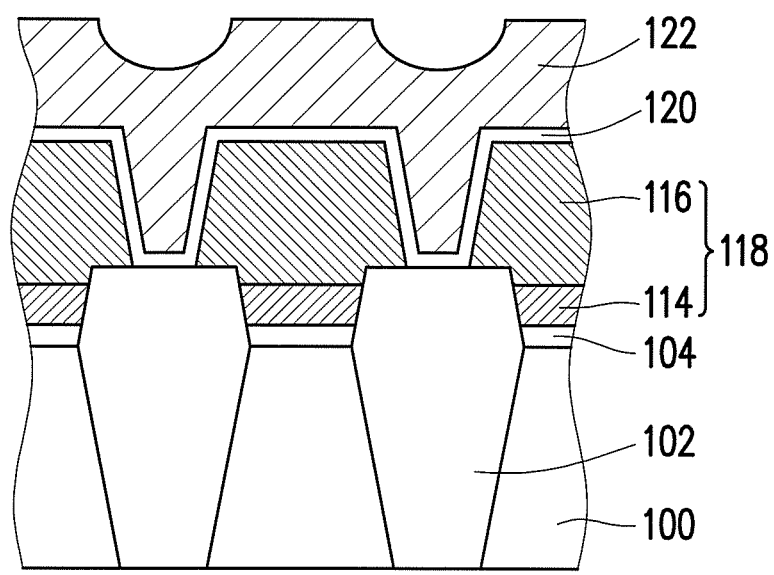

Referring to FIG. 1G, a dielectric layer 120 and a conductive layer 122 are sequentially formed on the substrate 100. A material of the dielectric layer 120 includes a dielectric material, such as silicon oxide, silicon nitride or silicon oxynitride. The dielectric layer 120 may be a single-layer structure, or may be a multilayer structure, such as silicon oxide/silicon nitride layers or silicon oxide/silicon nitride/silicon oxide layers. In the present embodiment, the materials of the dielectric layer 120 are, for example, silicon oxide/silicon nitride/silicon oxide. A method for forming the dielectric layer 120 is, for example, chemical vapor deposition. A material of the conductive layer 122 includes a conductive material, such as polysilicon, doped polysilicon or so forth. A method for forming the conductive layer 122 is, for example, chemical vapor deposition.

Next, the conductive layer 122, the dielectric layer 120 and the conductive structures 118 are patterned to form a non-volatile memory cell, wherein the conductive layer 122 is used as a control gate, the dielectric layer 120 is used as an inter-gate dielectric layer, and the conductive structures 118 are used as floating gates.

In view of the foregoing, the manufacturing method of the strip-shaped conductive structures, as provided in the invention, forms the conductive structures between the adjacent isolation structures. The conductive structures fill up the trenches between parts of the adjacent isolation structures, so that the floating gates can be adjusted to have planar shapes during the subsequent forming process of the floating gates, and thereby improve the reliability of the semiconductor device.

In view of the above, the manufacturing method of the non-volatile memory cell, as provided in the invention, can integrate the manufacturing process of a non-volatile memory cell structure and a logic circuit structure, so that the non-volatile memory cell structure and the logic circuit structure can together be formed in a same manufacturing process.

In summary, the manufacturing method of the non-volatile memory cell, as provided in the invention, forms the conductive structures between the adjacent isolation structures. The conductive structures fill up the trenches between parts of the adjacent isolation structures, so that the floating gates of the non-volatile memory cell can be adjusted to have planar shapes during the subsequent forming process of the floating gates. Further, during the subsequent forming process of the control gate, the control gate can be adjusted to have a planar shape, so that the reliability of the semiconductor device can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of strip-shaped conductive structures, comprising:
   providing a substrate having a plurality of isolation structures, wherein top surfaces of the isolation structures are higher than a top surface of the substrate;
   forming a first conductive layer on the substrate;
   forming a sacrificial layer on the first conductive layer;
   removing parts of the sacrificial layer while maintaining parts of the sacrificial layer on the first conductive layer between the isolation structures;
   removing parts of the first conductive layer by using the remaining parts of the sacrificial layer as masks, so as to form a plurality of first conductive structures between the adjacent isolation structures;
   removing the remaining parts of the sacrificial layer;
   forming a second conductive layer on the substrate, wherein the second conductive layer is electrically connected with the conductive structures; and
   patterning the second conductive layer, so that the patterned second conductive layer and the first conductive structures together form the strip-shaped conductive structures.

2. The manufacturing method of the strip-shaped conductive structures as recited in claim 1, before the step of forming the first conductive layer on the substrate, further comprising:
   forming a tunneling dielectric layer on the substrate between the isolation structures.

3. The manufacturing method of the strip-shaped conductive structures as recited in claim 1, wherein methods for forming the first conductive layer, the sacrificial layer and the second conductive layer respectively comprise chemical vapor deposition.

4. The manufacturing method of the strip-shaped conductive structures as recited in claim 1, wherein a method for removing the sacrificial layer comprises wet etching.

5. The manufacturing method of the strip-shaped conductive structures as recited in claim 1, wherein a method for removing parts of the first conductive layer comprises dry etching or wet etching.

6. The manufacturing method of the strip-shaped conductive structures as recited in claim 1, wherein a material of the sacrificial layer comprises silicon oxide or silicon nitride.

7. The manufacturing method of the strip-shaped conductive structures as recited in claim 1, wherein materials of the first conductive layer and the second conductive layer respectively comprise polysilicon or doped polysilicon.

8. A manufacturing method of a non-volatile memory cell, comprising:

providing a substrate having a plurality of isolation structures, wherein top surfaces of the isolation structures are higher than a top surface of the substrate;

forming a tunneling dielectric layer on the substrate between the isolation structures;

forming a first conductive layer on the substrate;

forming a sacrificial layer on the first conductive layer;

removing parts of the sacrificial layer while maintaining parts of the sacrificial layer on the first conductive layer between the isolation structures;

removing parts of the first conductive layer by using the remaining parts of the sacrificial layer as masks, so as to form a plurality of first conductive structures between the adjacent isolation structures;

removing the remaining parts of the sacrificial layer;

forming a second conductive layer on the substrate, wherein the second conductive layer is electrically connected with the first conductive structures;

patterning the second conductive layer, so that the patterned second conductive layer and the first conductive structures together form a plurality of second conductive structures;

sequentially forming a dielectric layer and a third conductive layer on the substrate; and patterning the third conductive layer, the dielectric layer and the second conductive structures to form the non-volatile memory cell.

9. The manufacturing method of the non-volatile memory cell as recited in claim 8, wherein methods for forming the first conductive layer, the sacrificial layer, the second conductive layer, the dielectric layer and the third conductive layer respectively comprise chemical vapor deposition.

10. The manufacturing method of the non-volatile memory cell as recited in claim 8, wherein a method for removing the sacrificial layer comprises wet etching.

11. The manufacturing method of the non-volatile memory cell as recited in claim 8, wherein a method for removing parts of the first conductive layer comprises dry etching or wet etching.

12. The manufacturing method of the non-volatile memory cell as recited in claim 8, wherein a material of the sacrificial layer comprises silicon oxide or silicon nitride.

13. The manufacturing method of the non-volatile memory cell as recited in claim 8, wherein materials of the first conductive layer, the second conductive layer and the third conductive layer respectively comprise polysilicon or doped polysilicon.

14. The manufacturing method of the non-volatile memory cell as recited in claim 8, wherein materials of the dielectric layer comprise silicon oxide/silicon nitride/silicon oxide.

15. The manufacturing method of the non-volatile memory cell as recited in claim 8, wherein the third conductive layer is used as a control gate, the dielectric layer is used as an inter-gate dielectric layer, and the second conductive structures are used as floating gates.

* * * * *